(12) United States Patent
Kao et al.

(10) Patent No.: US 9,786,634 B2
(45) Date of Patent: Oct. 10, 2017

(54) INTERCONNECTION STRUCTURES AND METHODS FOR MAKING THE SAME

(71) Applicant: NATIONAL TAIWAN UNIVERSITY, Taipei (TW)

(72) Inventors: Cheng-Heng Kao, Taipei (TW); Han-Tang Hung, Taipei (TW); Chun-Hsiang Yang, Taipei (TW); Yan-Bin Chen, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 14/802,903

(22) Filed: Jul. 17, 2015

(65) Prior Publication Data

US 2017/0018532 A1 Jan. 19, 2017

(51) Int. Cl.
*H01L 21/302* (2006.01)
*H01L 25/065* (2006.01)
*H01L 25/00* (2006.01)

(52) U.S. Cl.
CPC .......... *H01L 25/0657* (2013.01); *H01L 25/50* (2013.01); *H01L 2225/06513* (2013.01); *H01L 2225/06565* (2013.01)

(58) Field of Classification Search
CPC ............... H01L 25/50; H01L 25/0657; H01L 2224/03464; H01L 2224/11464; H01L 2224/27464
USPC .................................................. 438/678, 613
See application file for complete search history.

(56) References Cited

U.S. PATENT DOCUMENTS

| | | | | |
|---|---|---|---|---|
| 5,260,234 | A | 11/1993 | Long | |
| 5,821,625 | A * | 10/1998 | Yoshida | H01L 21/563 257/659 |
| 6,924,232 | B2 * | 8/2005 | Mathew | H01L 21/288 257/E21.174 |
| 8,367,468 | B2 * | 2/2013 | Yamaji | H01L 21/563 257/E21.598 |
| 8,399,979 | B2 | 3/2013 | Yamaji et al. | |
| 8,916,448 | B2 | 12/2014 | Cheng et al. | |
| 2003/0092261 | A1 * | 5/2003 | Kondo | B24B 37/005 438/638 |

(Continued)

OTHER PUBLICATIONS

He, A., et al., "Low-Temperature Bonding of Copper Pillars for All-Cooper Chip-to-Substrate Interconnections," Electrochemical and Solid State Letters, 9(12) C192-C195 (2006).

(Continued)

*Primary Examiner* — Nitin Parekh
(74) *Attorney, Agent, or Firm* — Perkins Coie LLP

(57) ABSTRACT

The present disclosure provides a method for interconnecting components. First and second substrates are provided. First and second components are respectively provided on the first and second substrates, in which the second component is not in contact with the first component. Then, a joint component is formed between the first and second components by passing a flow of a fluid comprising ions of a conductive material between the first and second components and electrolessly plating the first and second components by the conductive material so that the joint component is electrically connected between the first and second components. The present disclosure also provides related interconnection structures and a fixture for forming a related microchannel structure.

15 Claims, 11 Drawing Sheets

(56) References Cited

U.S. PATENT DOCUMENTS

| | | | |
|---|---|---|---|
| 2005/0164498 A1* | 7/2005 | Ide | C25D 3/38 438/678 |
| 2005/0245080 A1* | 11/2005 | Wang | H01L 21/02074 438/678 |
| 2006/0081478 A1* | 4/2006 | Sahoda | C25D 5/08 205/148 |
| 2006/0086616 A1* | 4/2006 | Kurashina | C25D 5/22 205/83 |
| 2007/0193510 A1* | 8/2007 | Saijo | C23C 18/1619 118/429 |
| 2007/0211115 A1* | 9/2007 | Ibe | B41J 2/14072 347/58 |
| 2008/0073795 A1 | 3/2008 | Kohl et al. | |
| 2010/0044870 A1 | 2/2010 | Yamaji et al. | |
| 2011/0042201 A1* | 2/2011 | Von Gutfeld | C25D 5/02 204/200 |
| 2011/0117357 A1* | 5/2011 | Hatanaka | H01L 24/29 428/312.8 |
| 2014/0191418 A1 | 7/2014 | Cheng et al. | |

OTHER PUBLICATIONS

Yamaji, T., et al., "Novel Flip-Chip Bonding Technology using Chemical Process," Nanoelectronics Research Institute, Electronic Components and Technology Conference, 898-904 (2007).

Osborn, T., et al., "All-Copper Chip-to-Substrate Interconnects Part I. Fabrication and Characterization," Journal of the Electrochemical Society, 155(4) D308-D313 (2008).

He, A., et al., "All-Copper Chip-to-Substrate Interconnects Part II. Modeling and Design," Journal of the Electrochemical Society, 155(4) D314-D322 (2008).

Yokoshima, T., et al., "A Method of "Chemical Flip-Chip-Bonding" Without Loading and Heating for Ultra-fine Chip-to-Substrate Interconnects," Nanoelectronics Research Institute, Electronic Components and Technology Conference, 80-86 (2009).

Osborn, T., et al., "Electroless Copper Deposition with PEG Suppression for All-Copper Flip-Chip Connections," Journal of the Electrochemical Society, 156(7) D226-D230 (2009).

Koo, H., et al., "All Copper Interconnection for Chip-to-Package Bonding," Abstract #2008, 218th ECS Meeting, The Electrochemical Society, (2010).

Yokoshima, Y., et al., "Anisotropic Deposition of Localized Electroless Nickel for Preferential Bridge Connection," Journal of the Electrochemical Society, 157(1) D65-D73 (2010).

An, P., et al., "Thermonechanical Modeling of All-Copper Chip-to-Substrate Connections," Abstract #2009, 218th ECS Meeting, The Electrochemical Society (2010).

Koo, H., et al., "Copper Electroless Bonding of Dome-Shaped Pillars for Chip-to-Package Interconnect," Journal of the Electrochemical Society, 158(12) D698-D703 (2011).

An, P.N., "Modeling Simplicfication for Thermal Mechanical Analysis of High Density Chip-to-Substrate Connections," Journal of Electronic Packaging, vol. 133, 041004-1-041004-7 (2011).

Lee, J., et al., "Novel Chip Stacking Process for 3D Integration," Institute of Microelectronics, Electronic Components and Technology Conference, 1939-1943 (2011).

Koo, H., et al., "Affect of Anneal Temperature on All-Copper Flip-Chip Connections Formed via Electroless Copper Deposition," IEEE Transactions on Components, Packaging and Manufacturing Technology, vol. 2(1), 79-84 (2011).

Koo, H., et al., "Electroless Copper Bonding with Local Suppression for Void-Free Chip-to-Package Connections," Journal of the Electrochemical Society, 159(5), D319-D322 (2012).

Lee, J., et al., "Electroless Ni Plating to Compensate for Bump Height Variation in Cu—Cu 3-D Packaging," IEEE Transactions on Components, Packaging and Manufacturing Technology, vol. 2(6), 964-970 (2012).

Lightsey, C.H., "All-Copper Chip-to-Substrate Interconnections for Flip-Chip Packages," Georgia Institute of Technology, 1-43 (2010).

Osborn, T.N., "All-Copper Chip-to-Substrate Interconnects for High Performance Integrated Circuit Devices," School of Chemical and Biomolecular Engineering, 1-121 (2009).

Saha, R., et al., "Fabrication and Thermo-Mechanical Characterization of Fine Pitch All-Copper Interconnect," Journal of the Electrochemical Society, 159(9), D532-D537 (2012).

* cited by examiner

INTERCONNECTION STRUCTURES AND METHODS FOR MAKING THE SAME

TECHNICAL FIELD

The present disclosure generally relates to electronics packaging, and more specifically relates to interconnection structures and methods for making interconnecting components.

BACKGROUND

During the past few decades in the electronics industry, Moore's Law has predicted that the number of transistors per unit area of a chip will double every 18 to 24 months, making the computing power of the chip ever more powerful. The number of input/output (I/O) counts of the chip has also increased to better take advantage of the exponentially growing computing power. The decreasing size of transistors often indicates that the increasing number of I/O counts (i.e., the decreasing I/O pitch) has to be realized in the same area, or proportionately even less.

Solder has been widely used to connect electronic components with each other and to connect electronic components to printed circuit boards (PCBs). However, as the I/O pitch decreases more and more, the size of the solder cannot decrease proportionally because of its intrinsic physical, chemical, and material properties.

One alternative to solder is the micro-interconnects, which comprise, among others, metal-based (e.g., copper) pillars or components. The metal-based pillars may achieve a finer I/O pitch and a better stand-off height, and have improved electrical and thermal properties. It is also possible that the metal-based pillars are conductive to lower manufacturing costs.

Accordingly, there is a need for an improved structure for interconnecting electronic components and for a method for making the improved interconnection structure.

SUMMARY

In accordance with an embodiment of the present disclosure, there is provided a method for interconnecting components. The method comprises the following steps. A first substrate and a second substrate are provided. A first component is provided on the first substrate. A second component is provided on the second substrate, wherein the second component is not in contact with the first component. A joint component is formed between the first and second components by passing a flow of a fluid comprising ions of a conductive material between the first and second components and electrolessly plating the first and second components by the conductive material so that the joint component is electrically connected between the first and second components.

In accordance with an embodiment of the present disclosure, there is provided an interconnection structure, which comprises: a first substrate; a first component coupled to the first substrate and having a first width; a second substrate; a second component coupled to the second substrate, the second component facing and not in contact with the first component and having a second width; and a joint component comprising a first portion and a second portion, the joint component connecting the first and second components, the first and second portions forming an interface having an interface width. In the interconnection structure, at least a part of the first portion surrounds the first component and at least a part of the second portion surrounds the second component. In the interconnection structure, the interface width is less than a sum of the first width and widths of the first portion and less than a sum of the second widthand widths of the second portion.

In accordance with an embodiment of the present disclosure, there is provided an interconnection structure, which comprises: a first substrate; a first component coupled to the first substrate, the first component having a first width; a second substrate; a second component coupled to the second substrate, the second component facing and not in contact with the first component and having a second width; and a joint component comprising a first portion and a second portion, the joint component being between and connecting the first and second components, the first and second portions forming an interface having an interface width. In the interconnection structure, the interface width is less than the first width and the second width.

In accordance with an embodiment of the present disclosure, there is provided a fixture for forming a microchannel structure. The fixture comprises: a first panel; a second panel comprising a first tube, a second tube and a channel, in which the second panel is in air-tight contact with the first panel; and a sample comprising a first substrate and a second substrate, the sample arranged between the first and second panels such that fluid may pass between the first and second substrates via the first tube, the second tube and the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
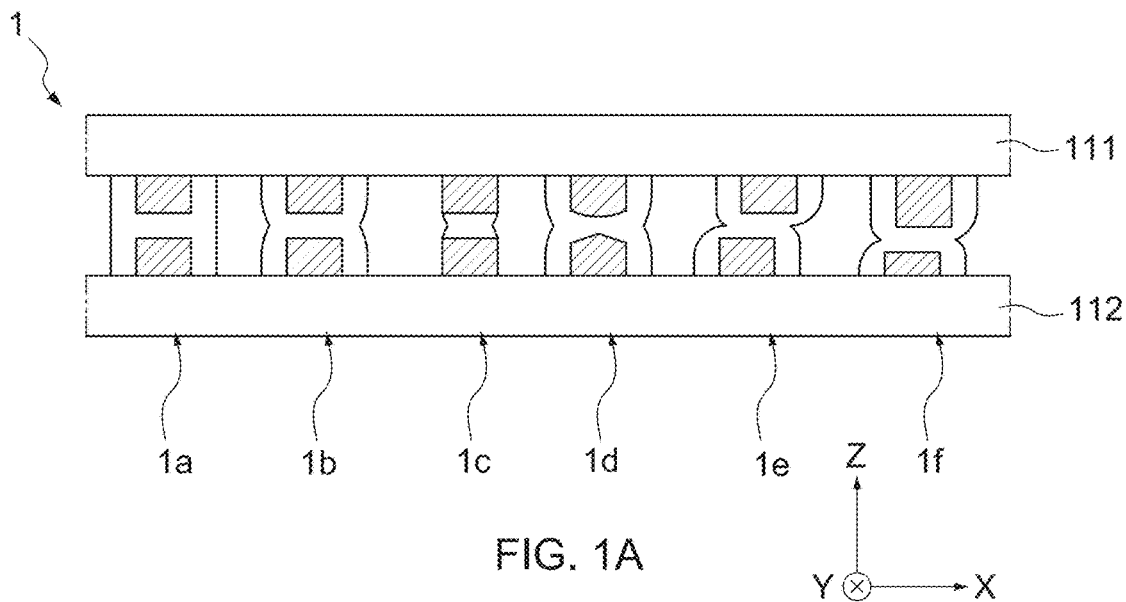
FIG. 1A is a schematic cross-sectional view of interconnection structures in accordance with some embodiments of the present disclosure.

In the figures illustrating various exemplary embodiments of the present disclosure, like reference numerals designate like parts for clarity.

FIG. 1A illustrates a semiconductor structure 1 in accordance with some embodiments of the present disclosure. The semiconductor structure 1 comprises a first substrate 111, a second substrate 112, and different kinds of interconnection structures 1a-1f in different embodiments. The pitch of the semiconductor structure 1, i.e., the distance between the interconnection structures, may be between about 5 µm and 800 µm. In some embodiments, the pitch of the semiconductor structure 1 may be between about 120 µm and 300 µm. As viewed and indicated in FIG. 1A, the X-direction is horizontal, the Z-direction is vertical, and the Y-direction penetrates FIG. 1A.

The first and second substrates 111, 112 may comprise $SiO_2$, low-K (low dielectric constant) materials, or any other suitable materials. In some embodiments, the first and second substrates 111, 112 may be, but are not limited to, individual semiconductor dies, semiconductor wafers, and semiconductor package substrates. The first and second substrates 111, 112 may have any suitable length (e.g., between 0.2 cm and 1.5 cm) in the Y-direction, width (e.g., between 0.2 cm and 1.5 cm) in the X-direction, and thickness (e.g., between 20 µm and 600 µm) in the Z-direction.

Each interconnection structure comprises a first component 121 formed on the first substrate 111, a second component 122 formed on the second substrate 112, and a joint component 130. The first and second components 121, 122 may have the shape of pillars, are not in contact with each other, and are connected by the joint component 130. In some embodiments, the respective first and second components 121, 122 are substantially aligned with each other, as illustrated by those of the interconnection structures 1a-1d. In some embodiments, the respective first and second components 121, 122 are not completely aligned with each other, as illustrated by those of the interconnection structures 1e and 1f. The degree of misalignment may be quantified by 50% of the average diameter (in the X, Y direction) of the first and second components 121, 122 and/or of the joint component 130.

The first and second components 121, 122 are made of conductive materials, such as copper, nickel, combinations thereof, and/or any other suitable materials.

The average thickness (in the Z-direction) of the first and second components 121, 122 may be between 1 µm and 100 µm. In some embodiments, the respective first and second components 121, 122 have the same height; in some embodiments, they have different heights. The top of the first and second components 121, 122 (i.e., the side opposite the respective first and second substrates 111, 112) may have different shapes, such as flat-top (see the interconnection structures 1a-1c, 1e and 1f), raised-top (see the first component 121 of the interconnection structure 1d), and pointed-top (see the second component 122 of the interconnection structure 1d). In some embodiments, the raised-top and/or pointed-top shapes may result in less cracking during and after the formation of the joint component 130.

The joint component 130 may comprise a first portion 131 and a second portion 132, which form an interface at 130a. The joint component 130 is electrically and physically connected to the first and second portions 131, 132. In some embodiments, at least a part of the first portion 131 surrounds the first component 121, and at least a part of the second portion 132 surrounds the second component 122. In some embodiments, the first and second portions 131, 132 do not surround the first or second components 121, 122.

The joint component 130 is made of a conductive material to electrically connect the first and second components 121, 122. The conductive material may comprise Ni, Cu, Ag, In, Pd, Co, electroless-plated metal composites, electroless-plated polyalloys, and/or combinations thereof. The material of the joint component 130 may be the same as or different from the material of the first and second components 121, 122. In some embodiments, the joint component 130 is made of substantially nickel as nickel is lower in cost, easier to obtain, and could be deposited faster.

Figure 1B:
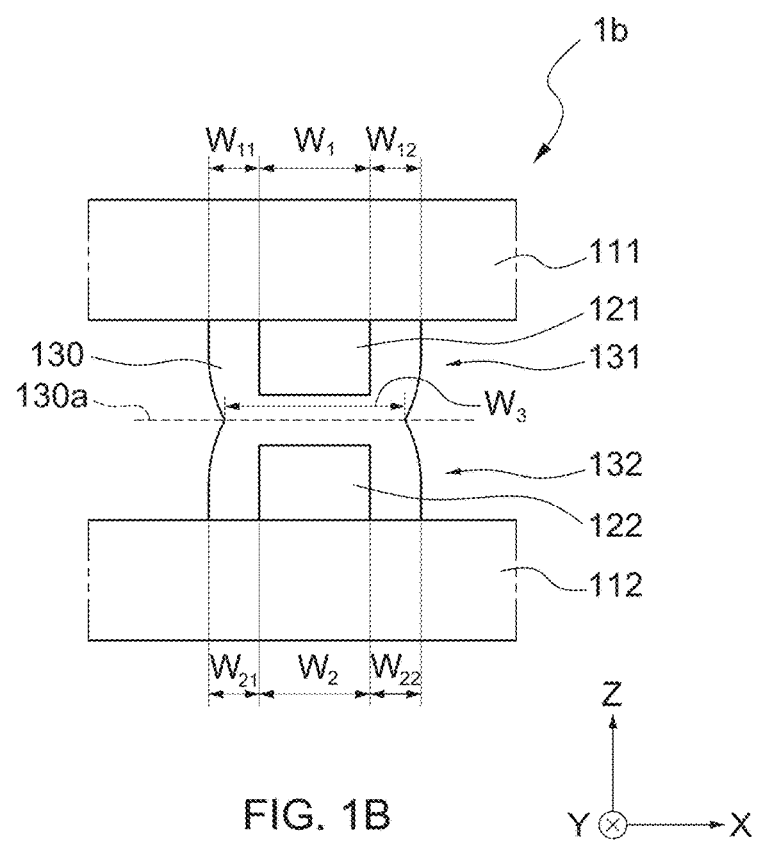
FIG. 1B is an enlarged cross-section view of an interconnection structure in accordance with a first embodiment of the present disclosure.

Refer now to FIG. 1B, which is an enlarged cross-section view of the interconnection structure 1b in accordance with an embodiment of the present disclosure. The interconnection structure 1b comprises the first and second substrates 111, 112, the first and second components 121, 122, and the joint component 130. The first and second components 121, 122 respectively have widths of $W_1$ and $W_2$. In some embodiments, $W_1$ and $W_2$ are substantially identical. In some embodiments, $W_1$ and $W_2$ may be different by less than 5%, 5% to 10%, 10% to 20%, 20% to 30%, 30% to 40%, 40% to 50%, or more than 50%. $W_1$ may either be larger or smaller than $W_2$.

In FIG. 1B, the joint component 130 comprises the first portion 131 and the second portion 132, which form an interface 130a with a width $W_3$. $W_3$ may be larger or smaller than $W_1$, and $W_3$ may be larger or smaller than $W_2$. At least a part of the first portion 131 surrounds the first component 121 and at least a part of the second portion 132 surrounds the second component 122. As illustrated in FIG. 1B, $W_3$ is smaller than the sum of $W_1$ and the cross-sectional widths $W_{11}$ and $W_{12}$ of the first portion 131, and $W_3$ is also smaller than the sum of $W_2$ and the cross-sectional widths $W_{21}$ and $W_{22}$ of the second portion 132. In some embodiments, the aforementioned quantitative relationships among $W_1$, $W_2$, $W_3$ and the cross-sectional width of the first and second portions 131, 132 may be a result of the method of manufacturing the interconnection structures as described in the present disclosure.

Figure 1C:
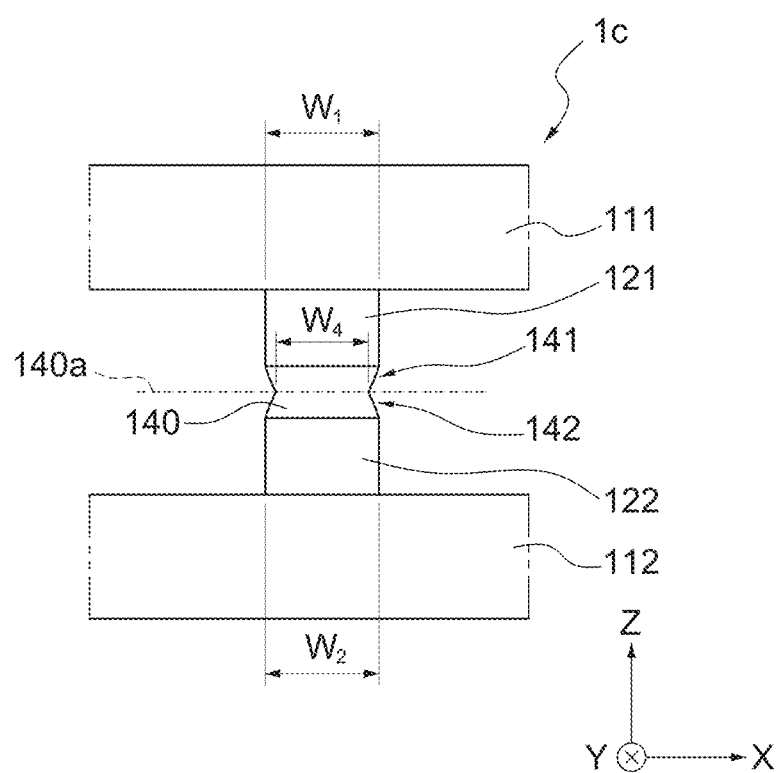
FIG. 1C is an enlarged cross-section view of an interconnection structure in accordance with a second embodiment of the present disclosure.

Refer now to FIG. 1C, which is an enlarged cross-section view of the interconnection structure 1c in accordance with an embodiment of the present disclosure. The interconnection structure 1c comprises first and second substrates 111, 112, first and second components 121, 122, and a joint component 140. The joint component 140 comprises a first portion 141 and a second portion 142, which form an interface 140a with a width $W_4$.

Figure 1D:
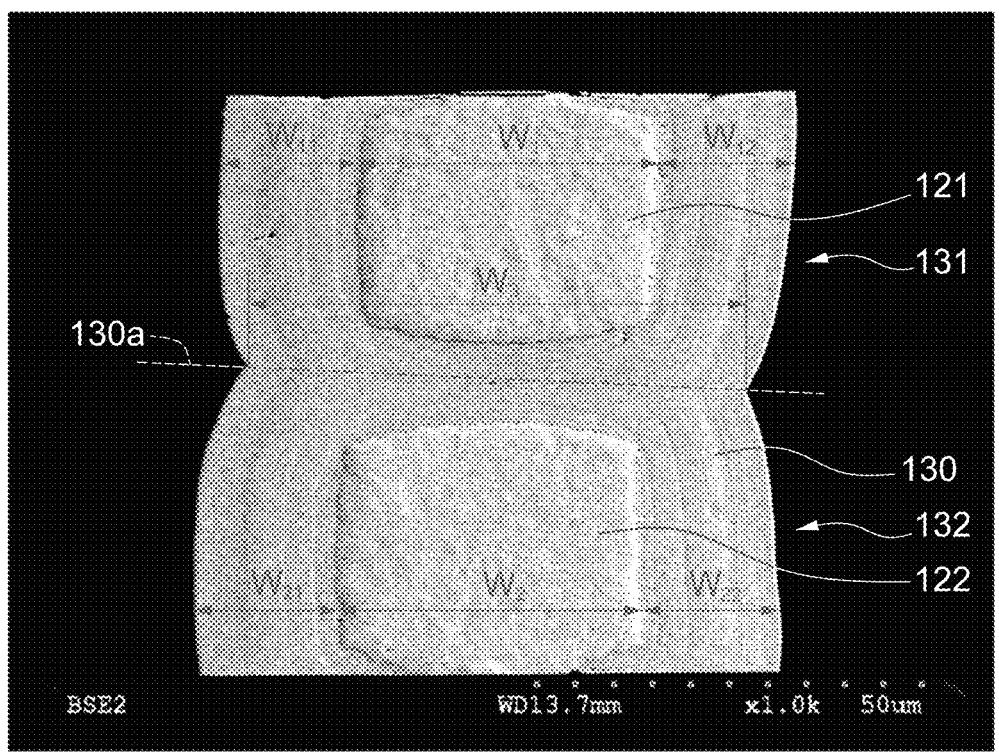
FIG. 1D is an enlarged cross-section view of an interconnection structure in accordance with a second embodiment of the present disclosure.

Refer now FIG. 1D, which is an enlarged cross-section view of an interconnection structure in accordance with an embodiment of the present disclosure. The interconnection structure in FIG. 1D is similar to that in FIG. 1B, except that the first and second substrates 111, 112 are not shown in FIG. 1D. As shown in FIG. 1D, the first and second components 121, 122 respectively have widths of $W_1$ and $W_2$. The first portion 131 of the joint component 130 has cross-sectional widths $W_{11}$ and $W_{12}$, and the second portion 132 of the joint component 130 has cross-sectional widths $W_{21}$ and $W_{22}$. $W_1$ and $W_2$ may be substantially equal or may be different. The interface 130a has a width $W_3$. $W_3$ is smaller than the sum of $W_1$, $W_{11}$ and $W_{12}$, and $W_3$ is also smaller than the sum of $W_2$, $W_{21}$ and $W_{22}$.

One difference between the interconnection structures 1b and 1c lies in the joint components 130, 140. The first and second portions 141, 142 of the joint component 140 do not surround the first or second component 121, 122. In some embodiments, $W_4$ may be less than $W_1$, less than $W_2$, or less than both $W_1$ and $W_2$.

Refer to FIGS. 2A-2H, which illustrate the interconnection structures at various stages of fabrication in accordance with some embodiments of the present disclosure.

Figure 2A:
FIGS. 2A-2H are schematic cross-sectional views of interconnection structures at various stages of fabrication in accordance with some embodiments of the present disclosure.
Figure 2B:
Figure 2C:
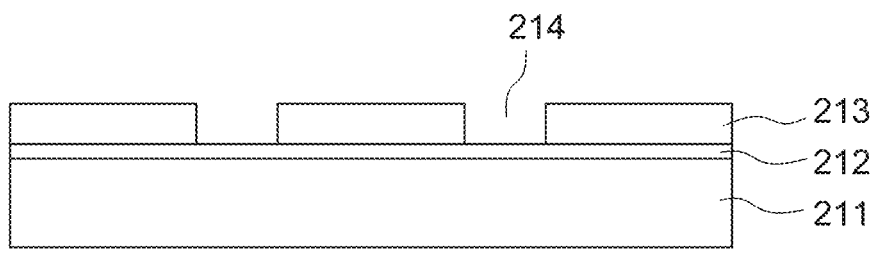
Figure 2D:
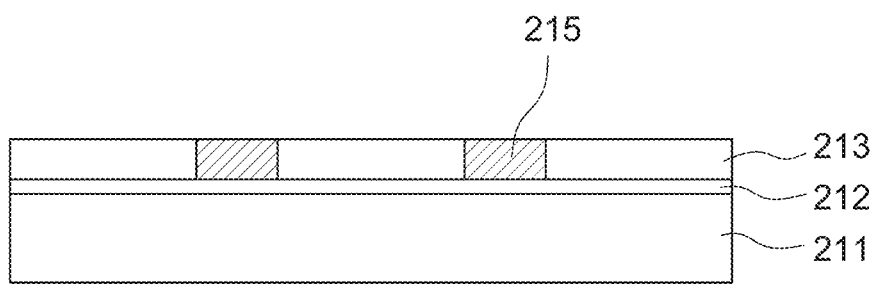
Figure 2E:
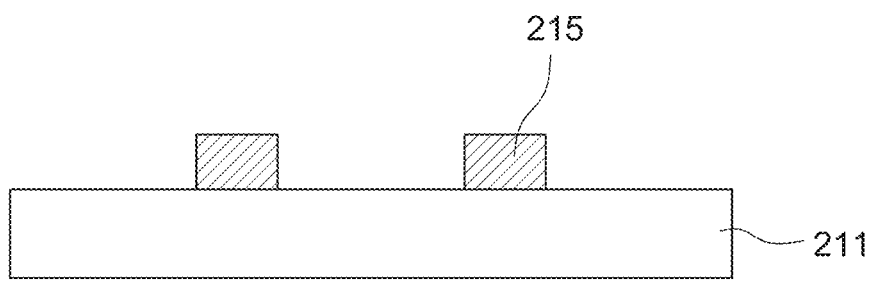
Figure 2F:
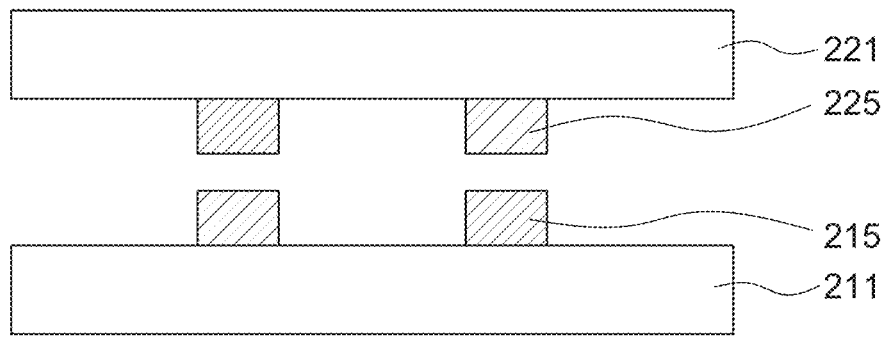

In FIG. 2A, a first substrate 211 is provided. In FIG. 2B, a seed layer 212 may be optionally provided above the first substrate 211. The seed layer 212 has the same material as to-be-formed first components 215 and has the advantage of facilitating the formation of the first components 215. In FIG. 2C, a patterned photoresist 213 with holes 214 is subsequently provided. In FIG. 2D, the first components 215 are formed in the holes 214 by deposition, electro-plating, electroless-plating, any other suitable methods, and/or combinations thereof. In FIG. 2E, the photoresist 213 and the seed layer 212 not covered by the first components 215 are removed. In FIG. 2F, a second substrate 221 with second components 225 formed thereon may be prepared by the abovementioned steps and then placed near the first substrate 211 in such a way that the first and second components 215, 225 face each other. The distance between the first and second substrates 211, 221 and/or the distance between the first and second components 215, 225 may be adjusted to desired values. In some embodiments, the distance between the first and second components 215, 225 may be between 1 µm and 100 µm.

Figure 2G:
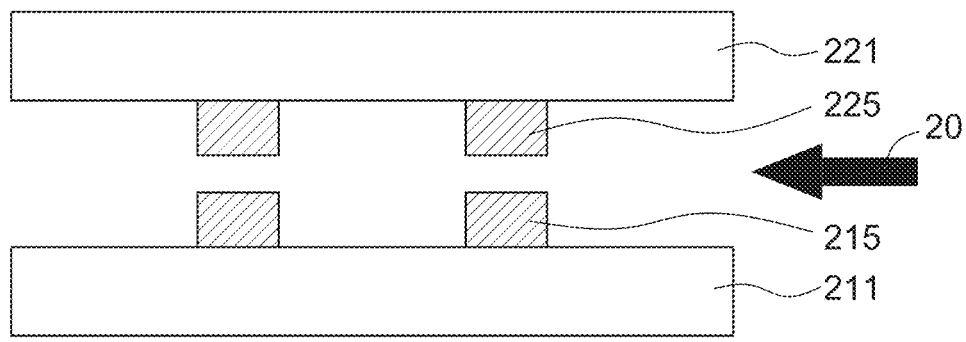
Figure 2H:
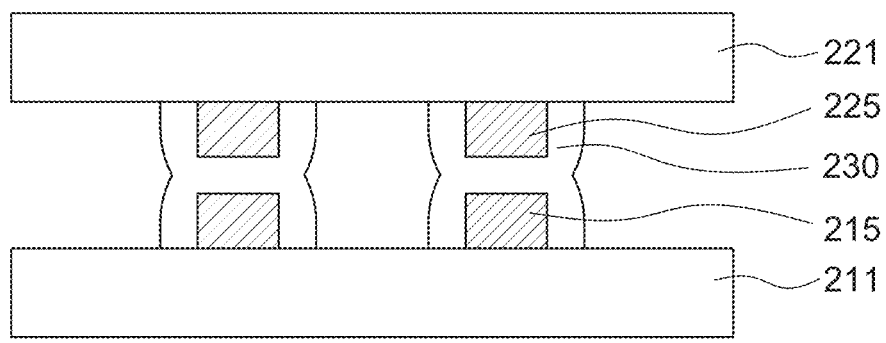

In FIG. 2G, a flow 20 of fluid (liquid or gas) is passed between the first and second components 215, 225. The fluid comprises ions of conductive materials. The application of the fluid flow 20 causes the conductive materials to be electrolessly deposited on the first and second components 215, 225, eventually leading to the formation of the joint component 230 connecting the first and second components 215, 225, as illustrated in FIG. 2H. The duration may be selected so as to form the desired amount/thickness/width of the joint component 230. In some embodiments, the duration of the fluid flow 20 is from 1 second to 10 hours. In some embodiments, external pressure is not applied to the first or second substrate 211, 221 during the formation of the joint component 230. The absence of external pressure may reduce cracking in the substrates 211, 212, the components 215, 225, and the joint component 230 compared to other manufacturing processes where excessive external pressure may break some parts of the interconnection structure.

The application of the fluid flow 20, and thus the formation of the joint component 230, may be, in some embodiments, performed at a substantially constant temperature. Here, "substantially constant temperature" is defined such that the temperature does not change by more than 10 degrees Celsius during the formation of the joint component 230. The substantially constant-temperature environment prevents excessive thermal expansion/contraction due to large temperatures changes. In cases where two materials have different coefficients of thermal expansion (CTE), the absence of large temperature changes reduces the likelihood of cracking induced by thermal stress due to CTE mismatches between the materials. In some embodiments, the formation of the joint component 230 may be performed at less than 300 degrees Celsius, less than 250 degrees Celsius, less than 200 degrees Celsius, less than 150 degrees Celsius, less than 100 degrees Celsius, or less than 50 degrees Celsius.

The fluid flow 20 may be applied at different flow rates. In some embodiments, the flow rate (which measures the volume of the fluid that passes per unit time) is between 0.010 µl/min and 100 ml/min. In some embodiments, the flow velocity (which measures the length of the fluid that flows per unit time) is between 0.1 µm/s and 10 cm/s. A higher flow rate, such as 15 ml/min, may improve the plating process and reduce $H_2$ entrapment, leading to possibly less voids (or seams) in the formed joint component 230.

Figure 5A:
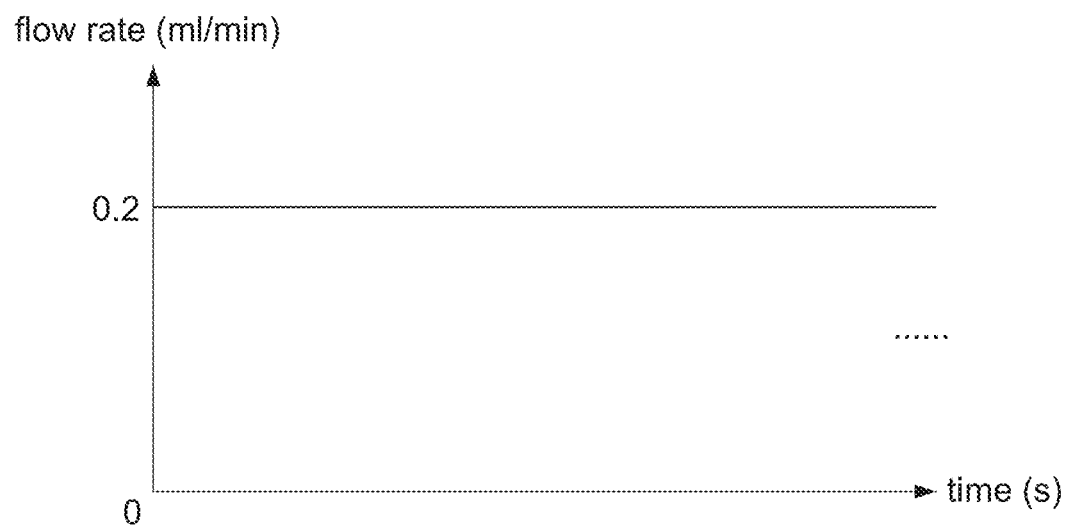
FIGS. 5A and 5B show conditions of the flow rate during interconnection of components, in accordance with some embodiments of the present disclosure.
Figure 5B:
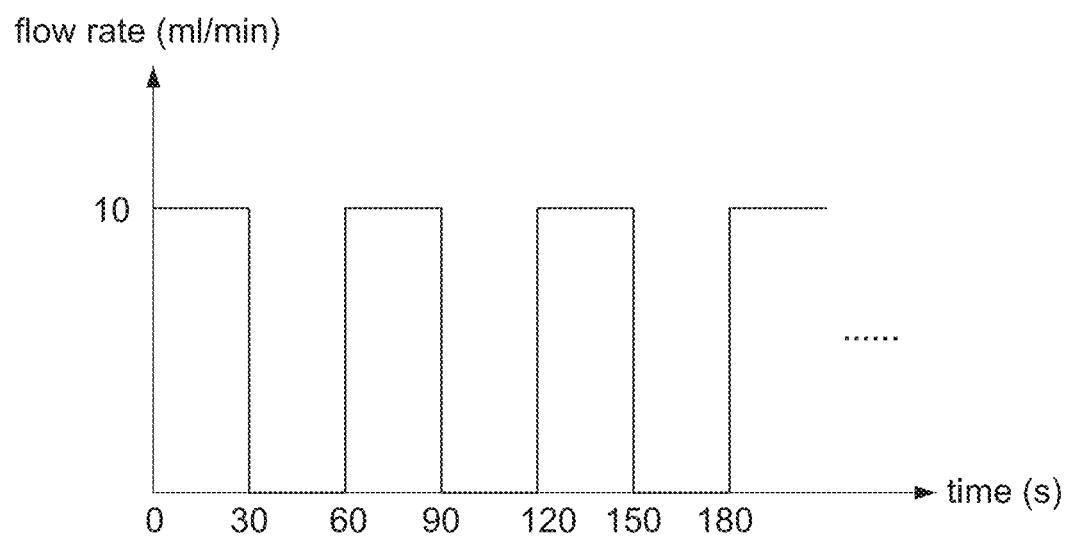

Temporarily refer to FIGS. 5A and 5B, which illustrate the conditions of the flow rate in accordance with some embodiments of the present disclosure. In FIG. 5A, the fluid flow 20 is applied at a substantially constant rate, such as 0.2 ml/min in one embodiment. In FIG. 5B, the fluid flow 20 changes periodically, such as between 0 and 10 ml/min in one embodiment. In the example of FIG. 5B, the flow rates change every 30 seconds, but other periods are also possible. Periodically changing the flow rate may help reduce voids/seams in the formed joint component 230.

Refer back to FIG. 2H, which illustrates interconnection structures similar to those seen in FIG. 1B. The joint component 230 formed by the application of the fluid flow 20 electrically and physically connects the first and second components 215, 225. During the formation of the joint component 230, the temperature is maintained substantially constant, and external pressure is not applied to the first and second substrates 211, 221. Therefore, less cracking and deformation exist in the interconnection structure made in accordance with the methods of the embodiments of the present disclosure than with methods that require large temperature changes (e.g., annealing) and/or external pressure (e.g., thermal pressing).

Refer to FIGS. 3A-3I, which illustrate the interconnection structures at various stages of fabrication in accordance with some embodiments of the present disclosure.

Figure 3A:
FIGS. 3A-3I are schematic cross-sectional views of interconnection structures at various stages of fabrication in accordance with some embodiments of the present disclosure.
Figure 3B:
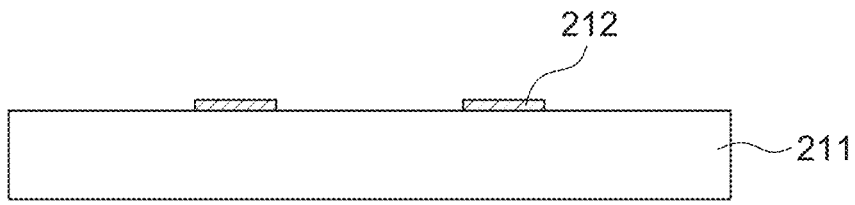
Figure 3C:
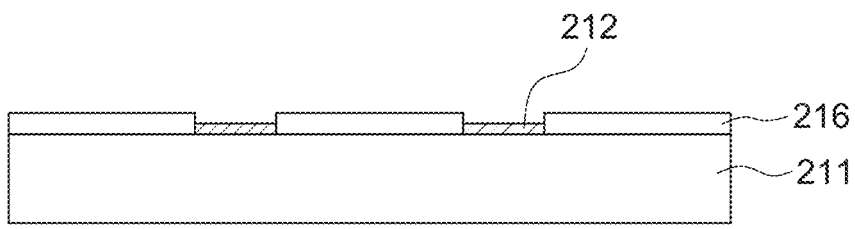
Figure 3D:
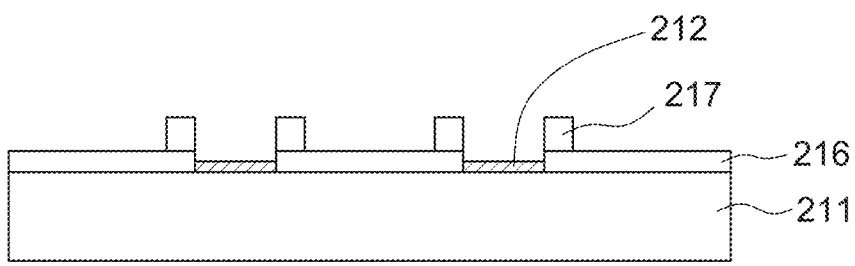
Figure 3E:
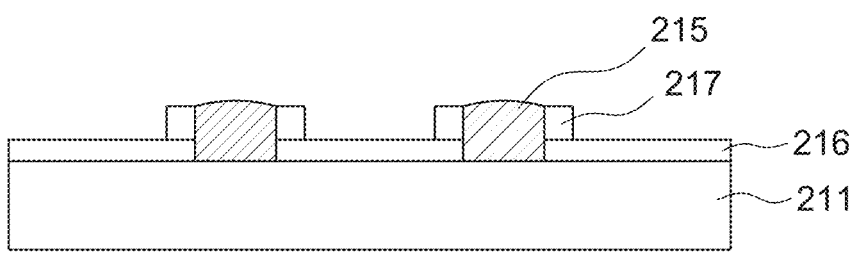
Figure 3F:
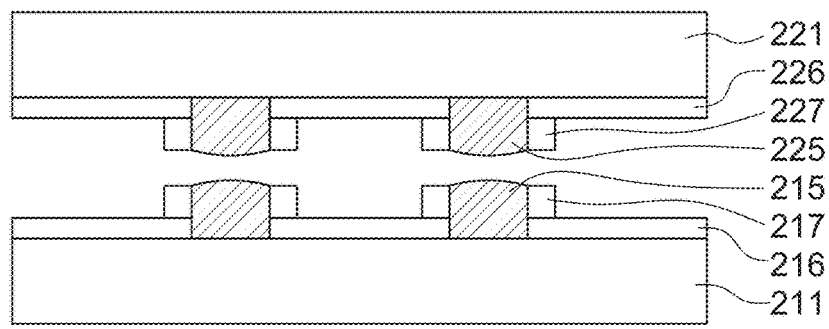

In FIG. 3A, a first substrate 211 is provided. In FIG. 3B, a patterned seed layer 212 may be optionally provided above the first substrate 211. The seed layer 212 has the same material as the to-be-formed first components 215 and has the advantage of facilitating the formation of the first components 215. In FIG. 3C, a patterned intermediate layer 216 may be formed on the first substrate 211 and may comprise materials such as $SiO_2$. The intermediate layer 216 may serve to prevent a short-circuit caused by conductive materials deposited on the first substrate 211 between the (yet-to-be-formed) first components 215. In FIG. 3D, at least one sidewall 217 may be formed on the patterned intermediate layer 216. The sidewall 217 has the advantage of preventing conductive materials from forming on the side surfaces of the (yet-to-be-formed) first components 215 during the formation of the joint component by applying the fluid flow 20. The sidewall 217 may also have the additional advantage of reducing the likelihood of short-circuit between the first components 215 due to excessive deposits of conductive materials from the application of the fluid flow 20. In FIG. 3E, the first components 215 are formed between the sidewalls 217 by deposition, electro-plating, electroless-plating, any other suitable methods, and/or combinations thereof. In FIG. 3F, a second substrate 221 with second components 225 formed thereon may be prepared by the abovementioned steps and then placed near the first substrate 211 with the first and second components 215, 225 facing each other. The distance between the first and second substrates 211, 221 and/or the distance between the first and second components 215, 225 may be adjusted to desired values. In some embodiments, the distance between the first and second components 215, 225 may be between 1 µm and 100 µm.

Figure 3G:
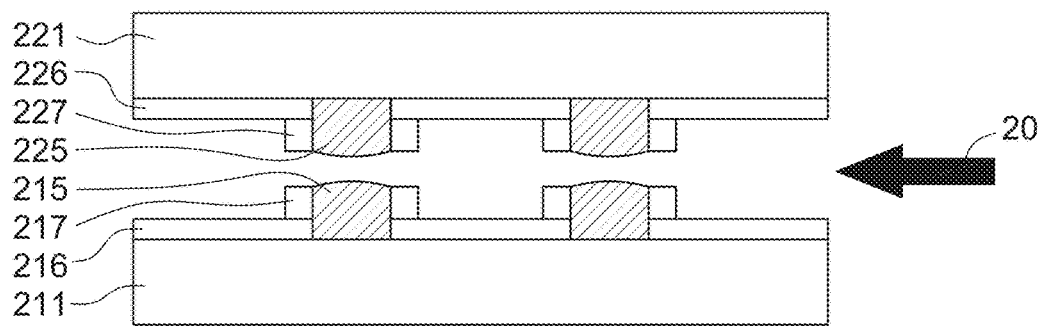
Figure 3H:
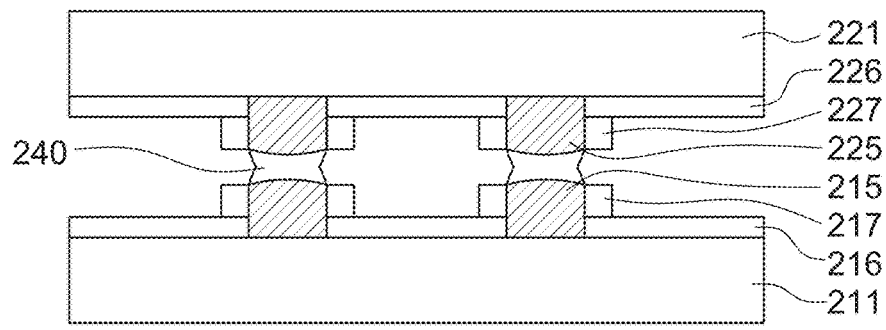
Figure 3I:
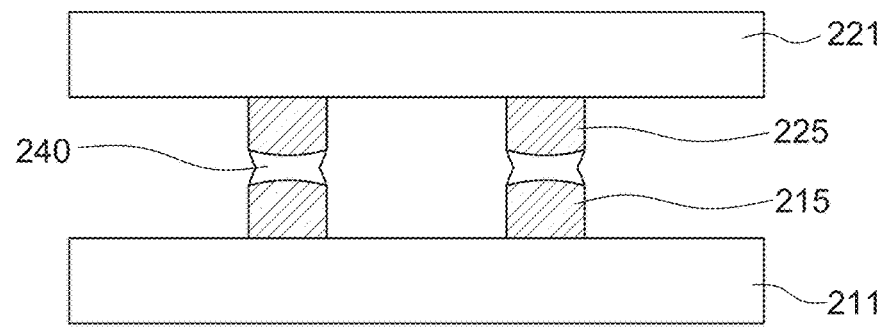

In FIG. 3G, a flow 20 of fluid (liquid or gas) comprising ions of conductive materials is passed between the first and second components 215, 225. Similar to FIG. 2G, the application of the fluid flow 20 causes the conductive materials to be electrolessly deposited on top of the first and second components 215, 225, eventually leading to the formation of the joint component 240 connecting the first and second components 215, 225, as illustrated in FIG. 3H. Note that the joint component 240 does not surround the first or second components 215, 225 because of the sidewalls 217, 227. As in FIG. 2G, the duration of the fluid flow 20 may depend on the desired amount/thickness/width of the joint component 240. In some embodiments, the duration of the fluid flow 20 is from 1 second to 10 hours. In some embodiments, the flow rate may be substantially constant or periodic, as discussed previously with respect to FIGS. 5A and 5B. In some embodiments, external pressure is not applied to the first or second substrate 211, 221 during the formation of the joint component 240. The absence of external pressure may reduce cracking in the substrates 211, 212, the components 215, 225, and the joint component 240 compared to other manufacturing processes where excessive external pressure may break some parts of the interconnection structure. In FIG. 3I, the intermediate layers 216, 226 and the sidewalls 217, 227 may be removed, although they do not have to be removed in some embodiments.

Figure 4:
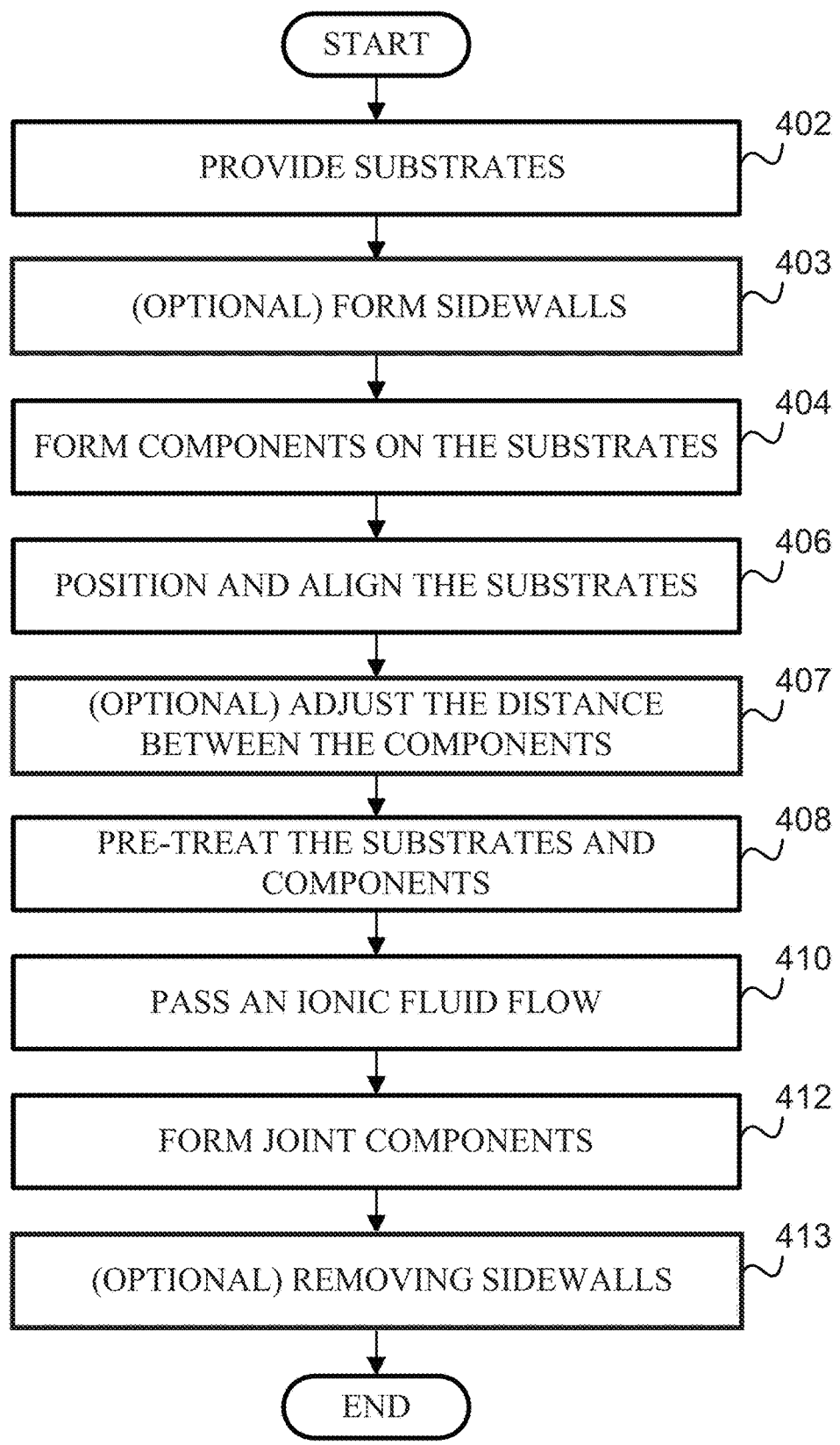
FIG. 4 is a flow chart illustrating a method for interconnecting components in accordance with some embodiments of the present disclosure.

Refer to FIG. 4, which illustrates a flow chart of a method for interconnecting components in accordance with some embodiments of the present disclosure. At step 402, substrates are provided; seed layers, patterned or not, may be optionally provided on the substrates to facilitate the subsequent formation of the components to be interconnected. At the optional step 403, sidewalls may be formed. At step 404, components to be interconnected (such as copper pillars) are formed on the respective substrates. At step 406, the substrates are positioned to face each other and, if desired, aligned; the distance therebetween may also be adjusted, as in the optional step 407. At step 408, the substrates and components are pre-treated. The pre-treatment comprises cleaning with acids or other chemicals in order to remove metal oxides and/or other undesired deposits that may cause contamination or other undesired effects during the formation of the joint component between the components to be interconnected. The pre-treatment may also comprise activating the components by providing them with a material (e.g., ions of Pd, Au, Ag) having a potential different from the potential of the material of the to-be-formed joint component so as to further facilitate the deposition of conductive materials on the components at later steps. Other cleaning and activation methods may also be possible. At step 410, a fluid flow comprising ions of conductive materials are passed between the components, thereby electrolessly depositng the conductive materials on the components and forming, at step 412, joint components interconnecting the components. In some embodiments, the formation of the joint component is performed at a duration of from 1 second to 10 hours. At the optional step 413, sidewalls may be removed.

Figure 6:
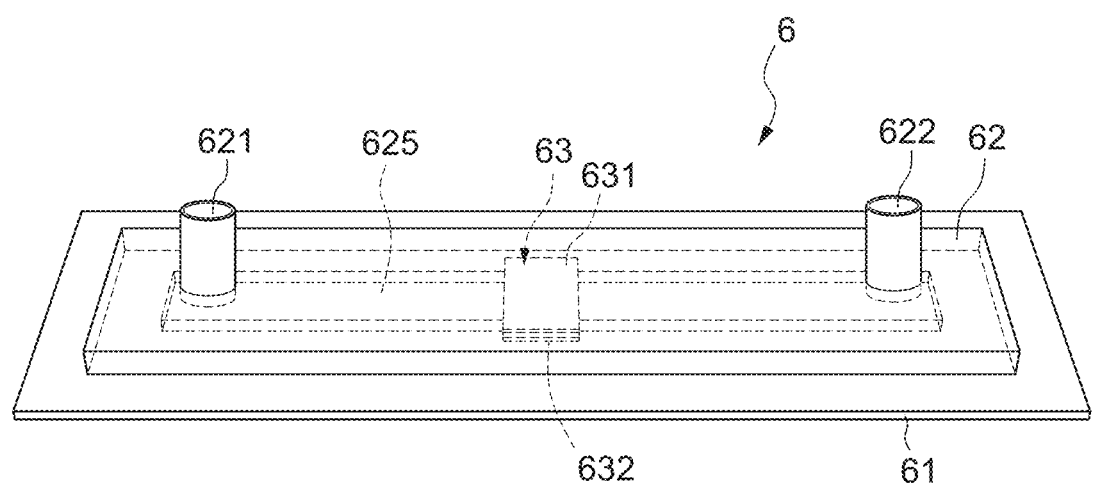
FIG. 6 illustrates a fixture that may be used to form interconnect components, in accordance with some embodiments of the present disclosure.

Refer to FIG. 6, which illustrates a fixture 6 that may be used to interconnect components, in accordance with some embodiments of the present disclosure. The fixture 6 comprises a first panel 61, a second panel 62, and a sample 63. The second panel 62 is in air-tight contact with the first panel 61 and comprises a first tube 621, a second tube 622 and a channel 625. The sample 63 is arranged between the first and second panels 61, 62 and comprises a first substrate 631 and a second substrate 632 each having components to be interconnected. The channel 625 is in fluid communication with the first and second tubes 621, 622 and is formed between the first and second substrates 631, 632 so that fluids may flow between the first and second substrates 631, 632 via the first tube 621, the channel 625 and the second tube 622.

The first and second panels 61, 62 may serve to hold the sample 63, align the first substrate 631 with the second substrate 632, and set the desired distance between the first and second substrates 631, 632. In some embodiments, the first panel 61 may be made of glass or other appropriate materials. In some embodiments, the second panel 62 may be made of polydimethylsiloxane (PDMS), polymethylmethacrylate (PMMA), polyethylene terephthalate (PET), polystyrene (PS), glass, ceramics, or metal. The size of the channel 625 may help determine the flow rate of the fluid passing between the first and second substrates 631, 632, thereby controlling parameters such as the plating rate. During the formation of joint components, the fixture 6 may facilitate the establishment of a substantially constant temperature by, e.g., being placed in a water tank. Since the first and second panels 61, 62 are in air-tight contact, placing the fixture 6 in the water tank would not disturb the formation of the joint components.

Figure 7:
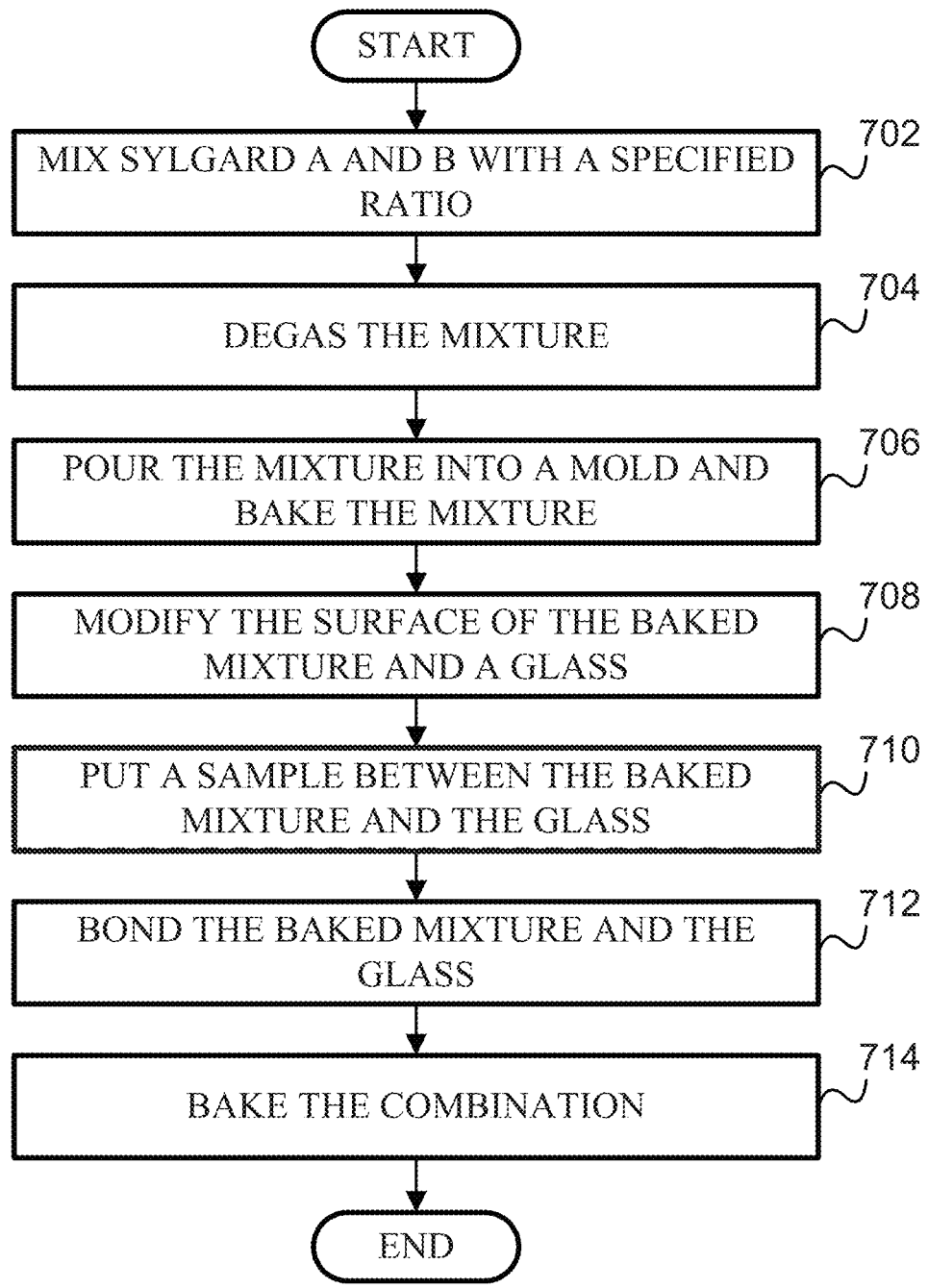
FIG. 7 is a flow chart for illustrating a method for making the fixture of FIG. 6, in accordance with some embodiments of the present disclosure.

Refer to FIG. 7, which illustrates a method for making the fixture 6, in accordance with some embodiments of the present disclosure. At step 702, two sylgard materials are mixed at a specified ratio, which may be between 1:1 and 1:10. At step 704, the mixture is degassed, e.g., by vacuuming or other appropriate methods. At step 706, the mixture is poured into a mold and then baked at an appropriate temperature and duration depending on the material composition of the mixture; in some embodiments, the mixture is baked at 30 degrees Celsius to 100 degrees Celsius for 5 minutes to 180 minutes. At step 708, the surface of the baked mixture is modified by, e.g., $O_2$ plasma; the surface of a panel made of a material such as glass may also be modified. The modified surfaces of the baked mixture and the panel may facilitate the formation of an air-tight contact between the baked mixture and the panel. At step 710, a sample is put between the baked mixture and the panel. At step 712, the baked mixture and the glass are bonded; the distance between the two substrates of the sample may also be adjusted. At step 714, the bonded combination is further baked at an appropriate temperature and duration. In one embodiment, the combination is baked at between 30 degrees Celsius and 100 degrees Celsius for 5 minutes to 180 minutes.

The above description provides features of the embodiments for those skilled in the art to better understand aspects of the present disclosure. It will be appreciated by those skilled in the art that the present disclosure may serve as a basis for arriving at other methods and structures for carrying out the same purposes and/or achieving the same advantages of the embodiments introduced herein. Such changes, substitutions, and alterations do not depart from the spirit and scope of the present disclosure.

What is claimed is:
1. A method for interconnecting components, the method comprising the following steps:
    forming a first component on a horizontal surface of a first substrate;

forming a second component on a horizontal surface of a second substrate, wherein the second component is not in contact with the first component;

positioning the first and the second substrates such that said horizontal surfaces face each other, with a gap between the horizontal surface of the first substrate and the horizontal surface of the second substrate; and directly forcing a fluid comprising ions of a conductive material to flow through the gap between the horizontal surface of the first substrate and the horizontal surface of the second substrate at a flow velocity, the fluid immersing the first and second components so as to electrolessly plate the first component and the second component by the conductive material in the fluid, the electroless plating forming a joint component that electrically connects the first component and the second component, wherein the flow of the fluid is controlled based on a pressure gradient determined by at least a distance of the gap between the horizontal surfaces of the first and second substrates, such that the flow velocity is in a range between 0.1 μm/s and 10 cm/s and a flow rate between 0.01 microliter/min and 100 ml/min.

2. The method of claim 1, wherein the fluid is a liquid.

3. The method of claim 1, wherein the electroless plating is performed at a temperature less than 250 degrees Celsius.

4. The method of claim 3, wherein the electroless plating is performed at a temperature less than 150 degrees Celsius.

5. The method of claim 4, wherein the electroless plating is performed at a temperature less than 100 degrees Celsius.

6. The method of claim 1, wherein the flow rate of the flow of the fluid changes periodically.

7. The method of claim 1, wherein the first substrate and the second substrate comprise $SiO_2$.

8. The method of claim 1, wherein the first substrate and the second substrate comprise a low-K material.

9. The method of claim 1, wherein the conductive material is selected from the group consisting of Ni, Cu, Ag, In, Pd, Co, electroless-plated metal composites, electroless-plated alloys, and combinations thereof.

10. The method of claim 1, wherein the first component and the second component comprise copper.

11. The method of claim 1, wherein the electroless plating is performed at a duration of from 1 second to 10 hours.

12. The method of claim 1, further comprising pre-treating the first component and the second component before the electroless plating.

13. The method of claim 12, wherein the step of pre-treating comprises:

cleaning the first component and the second component; and activating the first component and the second component.

14. The method of claim 1, further comprising:

forming sidewalls around the first component and the second component.

15. The method of claim 1, wherein the flow of the fluid is at a flow rate between 0.001 ml/min and 100 ml/min.

* * * * *